United States Patent [19]

Gardner et al.

[11] 4,275,380

[45] Jun. 23, 1981

[54] TOPOGRAPHY FOR INTEGRATED CIRCUIT FRAME CONTROL CHIP

[75] Inventors: Harry N. Gardner; Wayne R. Gravelle, both of Colorado Springs, Colo.

[73] Assignee: NCR Corporation, Dayton, Ohio

[21] Appl. No.: 43,930

[22] Filed: May 30, 1979

[51] Int. Cl.³ .............................................. G06K 7/14
[52] U.S. Cl. ............................. 340/146.3 Z; 235/456; 235/463
[58] Field of Search ................... 340/146.32; 235/463, 235/456; 250/566, 567, 568

[56] References Cited

U.S. PATENT DOCUMENTS

| | | | |
|---|---|---|---|
| 3,806,706 | 4/1974 | Hasslinger et al. | 340/146.3 Z |
| 3,811,033 | 5/1974 | Herrin et al. | 340/146.3 Z |
| 4,048,617 | 9/1977 | Neff | 340/146.3 Z |
| 4,059,225 | 11/1977 | Maddox | 235/463 |
| 4,108,368 | 8/1978 | Dobras | 235/463 |
| 4,140,271 | 2/1979 | Nojiri et al. | 235/456 |
| 4,147,295 | 4/1979 | Nojiri et al. | 340/146.3 Z |

*Primary Examiner*—Leo H. Boudreau
*Attorney, Agent, or Firm*—J. T. Cavender; Philip A. Dalton

[57] ABSTRACT

An integrated circuit for sequentially receiving a plurality of digital character words produced in response to optical scanning of a bar coded label and a plurality of corresponding binary signals representing, respectively, validity, scanning direction, and timing of the digital character words includes first, second, third, and fourth sequentially located edges forming a rectangle. The integrated circuit includes input circuitry for receiving the digital character words and corresponding binary signals and further includes twelve shift registers for storing predetermined ones of the digital character words. Four frame counters and associated control circuitry responsive to the binary signals and the character words steer the incoming character words to predetermined ones of the shift registers. The integrated circuit outputs formatted character words to a digital processor system. A command decoder receiving commands from a digital processor system controls the outputting of valid, properly formatted digital character words from predetermined ones of the shift registers in response to an interrupt signal produced when a properly formatted character word is contained in one of the shift registers. The input circuitry is generally located adjacent the corner formed by the third and fourth edges. The frame counters and associated control circuitry are generally located substantially closer to the fourth edge than to the second edge. The twelve groups of shift registers are generally located between the frame state counters with their associated control circuitry and the second edge. The command decode circuitry is located adjacent the second edge.

6 Claims, 13 Drawing Figures

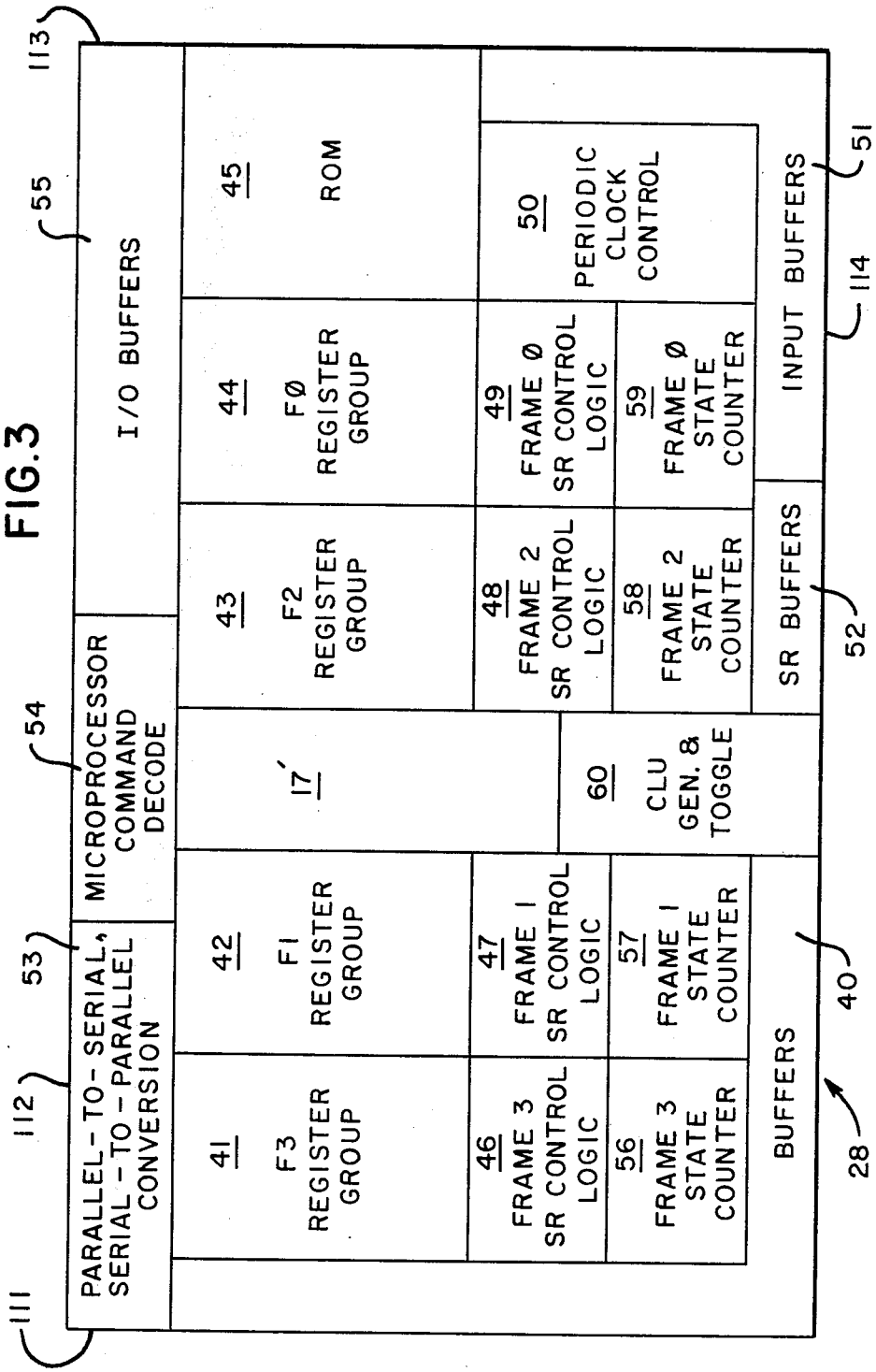

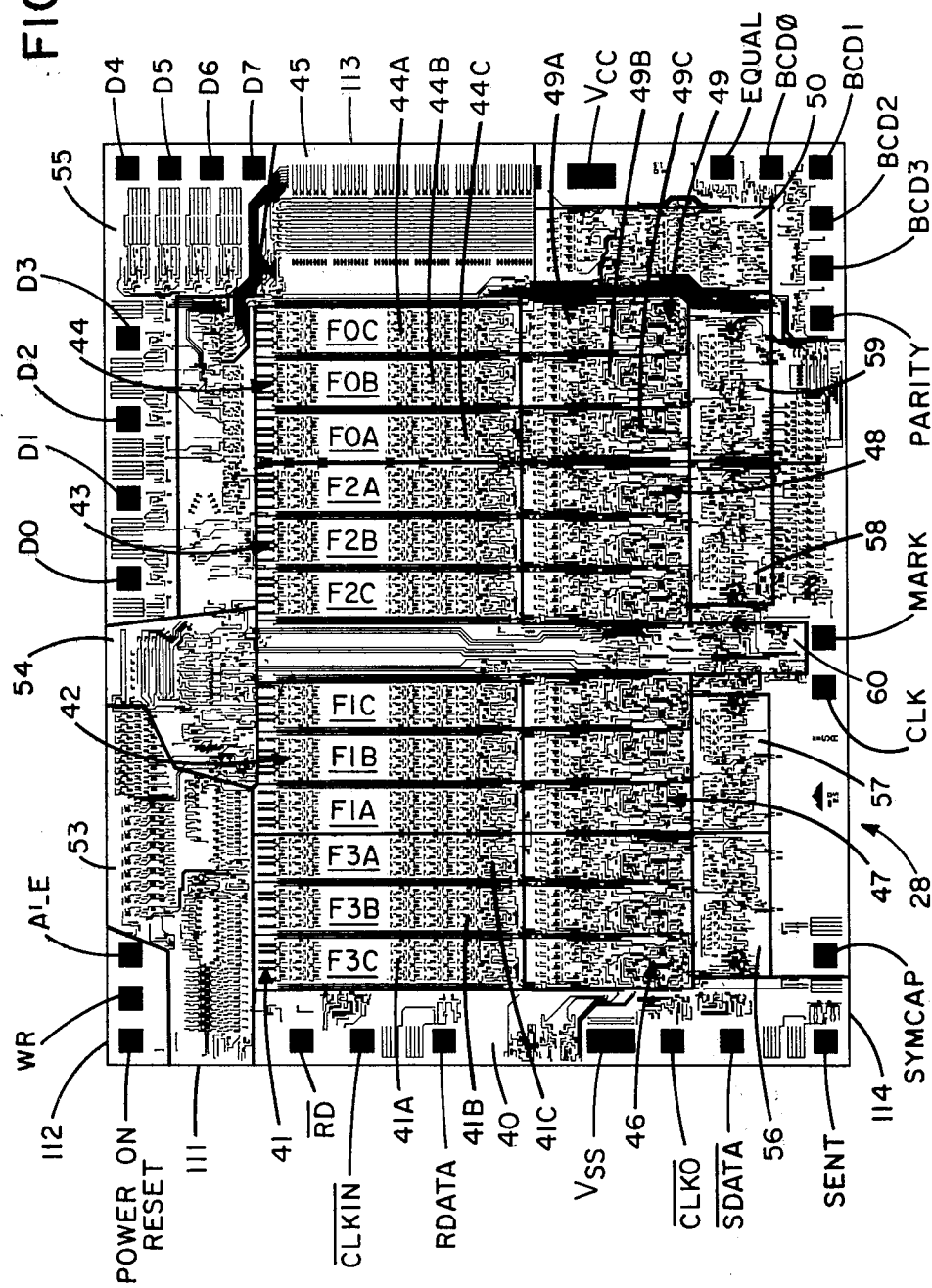

FIG. 11

| Pin | Type | | Type | Pin |
|---|---|---|---|---|
| VSS — 1 | P | O | 28 — RDATA |
| $\overline{\text{CLKOUT}}$ — 2 | IN | IN | 27 — $\overline{\text{CLKIN}}$ |
| $\overline{\text{SDATA}}$ — 3 | IN | IN | 26 — $\overline{\text{RD}}$ |
| $\overline{\text{SENT}}$ — 4 | O | IN | 25 — $\overline{\text{PWRRST}}$ |
| $\overline{\text{SYMCAP}}$ — 5 | O | IN | 24 — $\overline{\text{WR}}$ |
| CLK — 6 | IN | IN | 23 — ALE |
| MARK — 7 | IN | I/O | 22 — DB0 |
| PARITY — 8 | IN | I/O | 21 — DB1 |
| BCD3 — 9 | IN | I/O | 20 — DB2 |
| BCD2 — 10 | IN | I/O | 19 — DB3 |
| BCD1 — 11 | IN | I/O | 18 — DB4 |
| BCD0 — 12 | IN | I/O | 17 — DB5 |
| EQ — 13 | IN | I/O | 16 — DB6 |
| VDD — 14 | P | I/O | 15 — DB7 |

IN = INPUT
O = OUTPUT
P = POWER
I/O = BIDIRECTIONAL

TOPOGRAPHY FOR INTEGRATED CIRCUIT FRAME CONTROL CHIP

BACKGROUND OF THE INVENTION

1. Field of the Invention

The invention relates to integrated circuits for economically and rapidly processing digital information produced in response to optical scanning of bar coded labels.

2. Description of the Prior Art

The size of an integrated circuit, i.e., the "chip size" is an important factor in the ultimate cost of the integrated circuit to the final user. Another important cost is the engineering and design cost. The larger the number of units of the integrated circuit which are manufactured, the smaller is the engineering and design cost per unit. However, the chip size becomes an increasingly dominant factor in the ultimate product cost as the manufacturing volume of the product increases. For state of the art MOS (metal-oxide-semiconductor) large scale integrated (LSI) devices, very large numbers of MOSFETS (metal-oxide-semiconductor field effect transistors) are fabricated on a single monolithic silicon "chip", which is frequently less than 250 mils square. Thousands of conductive lines, some composed of polycrystalline silicon and others composed of aluminum, interconnect the various elements of the MOSFETS. Minimum line widths and spacings between the respective lines and the MOSFETS must be maintained to avoid short circuits and parasitic effects. Yet the length of the interconnecting lines and their associated capacitances must be minimized not only to reduce chip size, but also to achieve maximum circuit operating speeds. A wide variety of trade-offs, including the necessity to minimize chip size, obtain a suitable chip aspect ratio (which enhances integrated circuit chip yield and wire bonding yield), increase circuit operating speed, reduce power comsumption, and achieve acceptable reliability are involved in obtaining an optimum "layout" (arrangement of MOSFETS and interconnection pattern therebetween) in order to obtain a MOSLSI circuit which is both economical and has acceptable operating characteristics. Often, the technical and commercial success of an electronic product utilizing MOSLSI technology may hinge on the ability of the chip designer to achieve an optimum chip topography.

A very high level of creative interaction between the circuit designer and the chip designer or layout draftsman is required to achieve a chip topography or layout which enables the integrated circuit to have acceptable operating speed and power dissipation and yet is sufficiently small to be economically feasible. Months of such interaction resulting in numerous trial layout designs and redesigns and circuit design revisions may be required to arrive at an optimum topography for a single MOSLSI chip. Although the computer aided design (CAD) approach in the past has been attempted in order to generate optimum MOSLSI topography designs, this approach has been only moderately successful, and only to the extent that the CAD approach sometimes provides a rapid chip topography design. However, such a topography design usually has mediocre performance and usually results in unduly large, uneconomical semiconductor chips. It is well established in the integrated circuit industry that CAD approaches to generating MOSLSI chip layouts do not yet come close to achieving the topography design optimization which can be accomplished by human ingenuity applied to the task.

Some of the numerous design constraints faced by the MOSLSI chip designer include specifications for the minimum widths and spacing of diffused regions in the silicon, the minimum size required for contact openings in the insulating field oxide, the spacings required between the edges of contact openings to the edge of diffused regions, minimum widths and spacing of polycrystalline silicon conductors, the fact that such polycrystalline silicon conductors cannot "cross over" diffused regions, the minimum widths and spacings between the aluminum conductors, and the constraint that conductors on the same layer of insulating oxide cannot cross over like conductors. The high amount of capacitance associated with diffused regions and the resistances of both diffused regions and polycrystalline silicon conductors must be carefully considered by the circuit designer and the chip designer in arriving at an optimum chip topography.

For many types of logic circuits, such as those in the present invention, a very large number of conductive lines between sections of the logic circuitry are required. The practically infinite number of possibilities for routing the various conductors and placing the various MOSFETS taxes the skill and ingenuity of even the most skillful chip designers and circuit designers, and is beyond the capability of the most sophisticated computer programs yet available.

Other constraints faced by the chip designer and circuit designer involve the need to minimize cross coupling and parasitic effects which occur between various conductive lines and conductive regions. Such effects may degrade voltages on various conductors, leading to inoperative circuitry or low reliability operation under certain operating conditions.

Accordingly, it is an object of the present invention to provide an integrated circuit chip for formatting digital characters by a pattern recognition array in response to optical scanning of a bar coded label, which integrated circuit has a topography which provides maximum possible circuit operating speed with lowest possible chip size and power dissipation.

SUMMARY OF THE INVENTION

Briefly described, and in accordance with one embodiment thereof, the invention provides topography for integrated circuits for sequentially receiving a plurality of digital character words produced in response to optical scanning of a bar coded label, the integrated circuit having first, second, third and fourth sequentially located edges forming a rectangle. The integrated circuit also sequentially receives a plurality of binary signals corresponding to a plurality of digital character words, the binary signals representing, respectively, validity, scanning direction, and timing of the digital character words. The integrated circuit outputs and transmits formatted character words to a digital processor system coupled to the integrated circuit. The integrated circuit includes input interface circuitry for receiving digital character words and the binary signals and also includes a plurality of shift registers coupled to the input logic circuitry for storing predetermined ones of the digital character words. In the described embodiment of the invention, the integrated circuit includes 12 shift registers arranged in four groups of three each. The character words are routed by means of a four frame state counters and associated control circuitry into the four groups of shift registers, respectively. The integrated circuit includes means for detecting when a valid, properly formatted character is loaded into one of the registers and means for interrupting a processor system when this condition occurs. The processor system transmits commands to the integrated circuit, thereby causing the integrated circuit to transmit the valid, properly formatted character word to an output bus. The input circuitry is located substantially closer to the third and fourth edges than to the first and second edges. The frame counters are located substantially closer to the fourth edge than to the second edge. The four groups of shift registers are located between the frame counters and the second edge. The processor command decoding system is located generally adjacent the second edge.

BRIEF DESCRIPTION OF THE DRAWINGS

FIG. 3 is a block diagram illustrating the general location of sections of circuitry on the integrated circuit of the present invention.

FIG. 7A is identical to FIG. 7 except that major sections of circuitry of the integrated circuit of the present invention have been outlined and identified by reference numerals.

FIG. 11 is a diagram illustrating the package and lead configuration of the package in which the integrated circuit of the present invention is ultimately housed.

DESCRIPTION OF THE INVENTION

The invention described herein is closely related to the disclosure in the patent application entitled "Symbol Decoding System", by Gene L. Amacher and Syed Naseem, Ser. No. 043,933 filed May 30, 1979 the patent application entitled "Symbol Processing System", by Denis M. Blanford and Syed Naseem, Ser. No. 043,971 filed May 30, 1979, the patent application entitled "Slot Scanning System", by Gene L. Amacher, Syed Naseem and Denis M. Blanford, Ser. No. 043,928, filed May 30, 1979 and the patent application entitled "Topography For Integrated Circuit Pattern Recognition Array", by Rod Orgill and and Michael Janes, Ser. No. 043,929, filed May 30, 1979, all assigned to the present assignee, all filed on even date herewith, and all incorporated herein by reference.

Figure 2A:
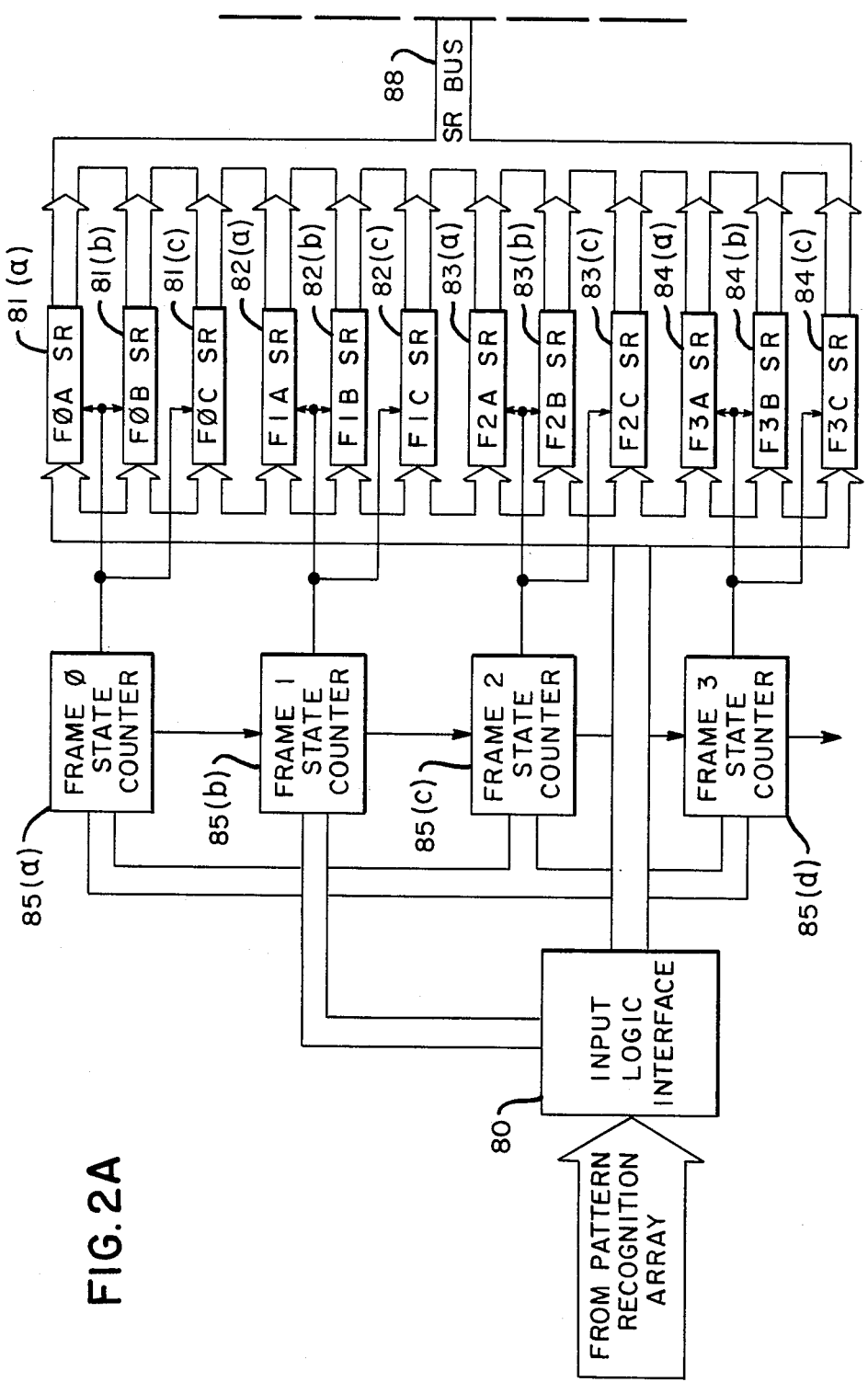
FIGS. 2A and 2B are a block diagram of the frame control array embodied in the integrated circuit of the present invention.
Figure 2B:
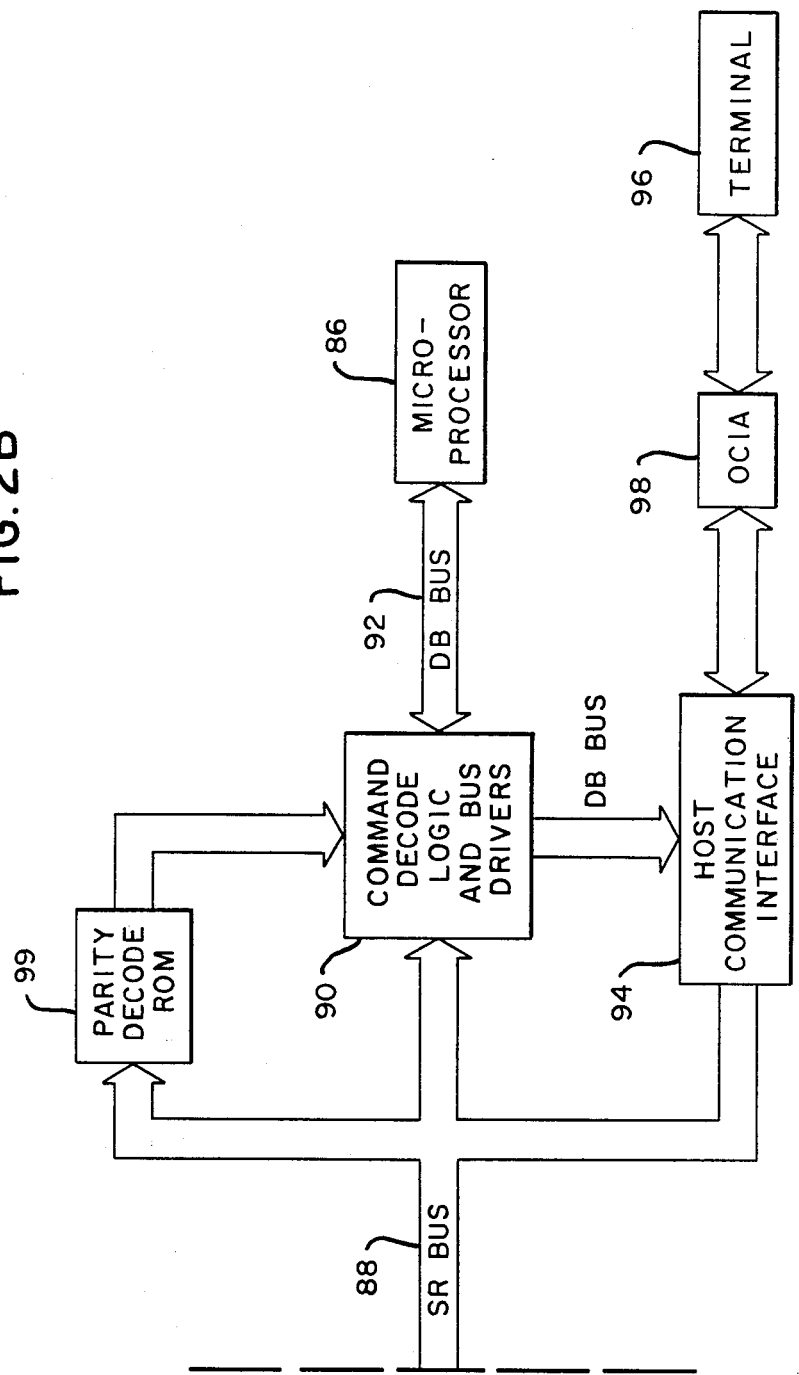
Figure 4:
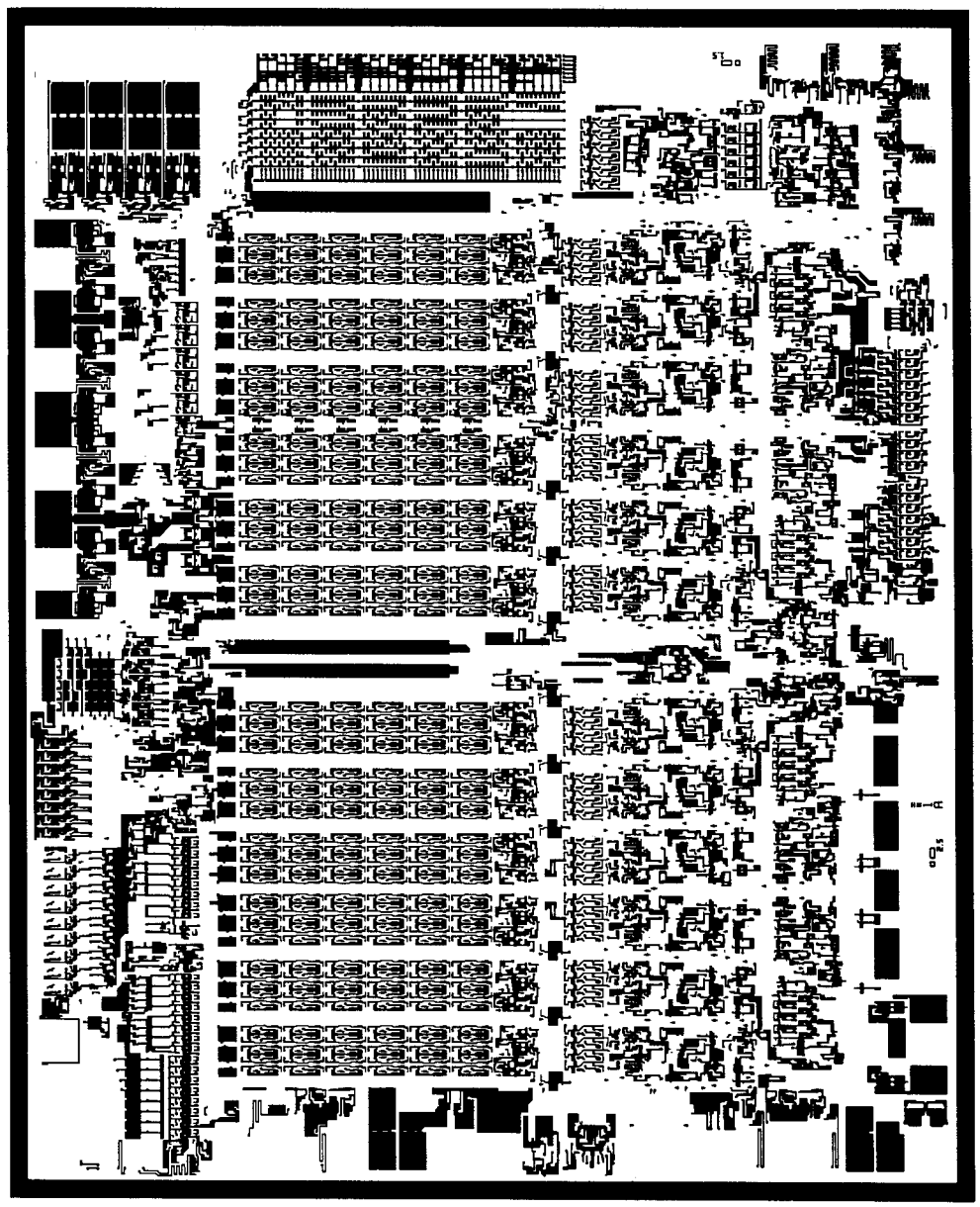
FIG. 4 is a scale reproduction of a photomask utilized to define the pattern of the source-drain diffused regions and diffused interconnect regions in the integrated circuit of the present invention.
Figure 5:
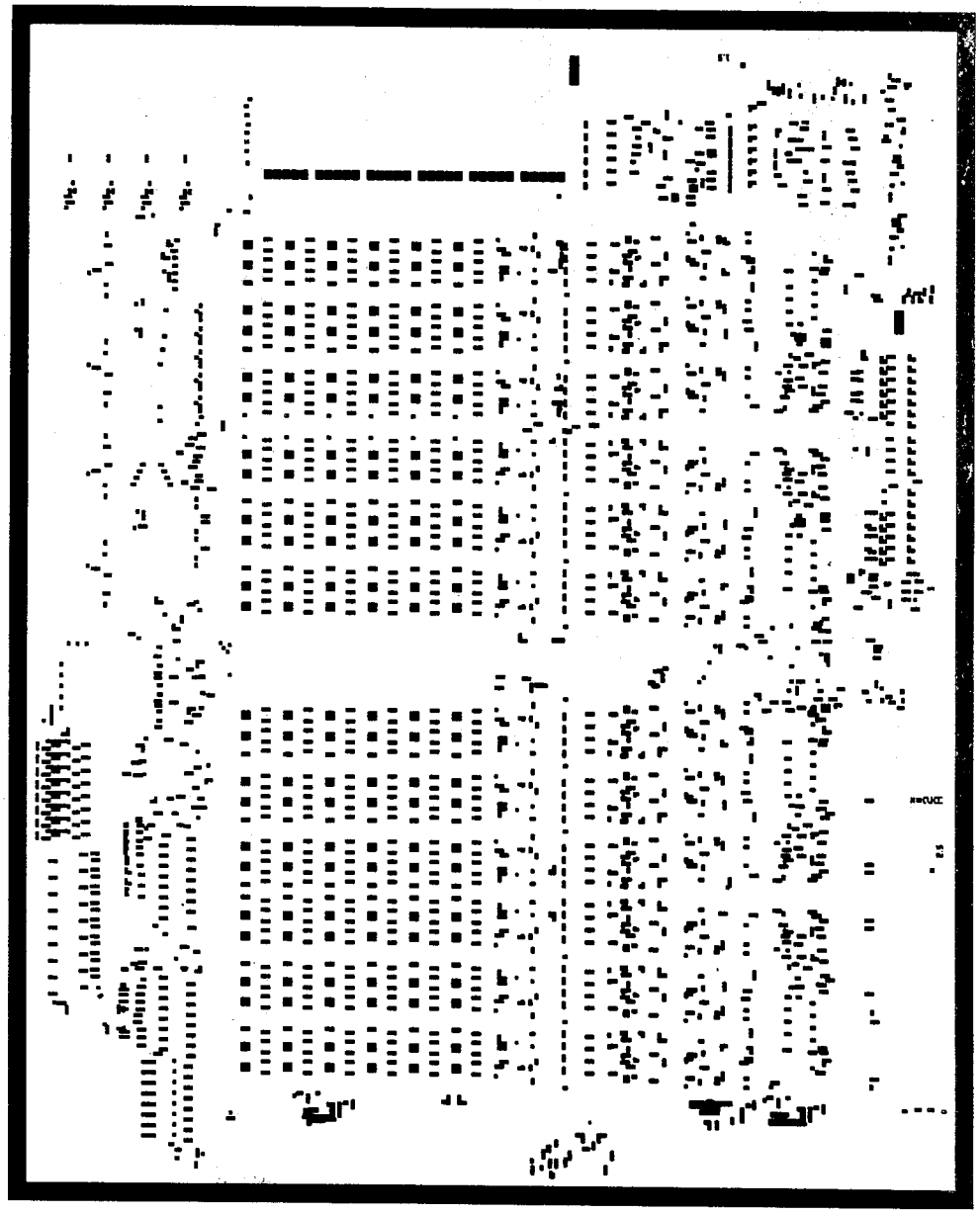
FIG. 5 is a scale reproduction of a photomask used to define the pattern of the ion implanted depletion regions of the integrated circuit of the present invention.
Figure 6:
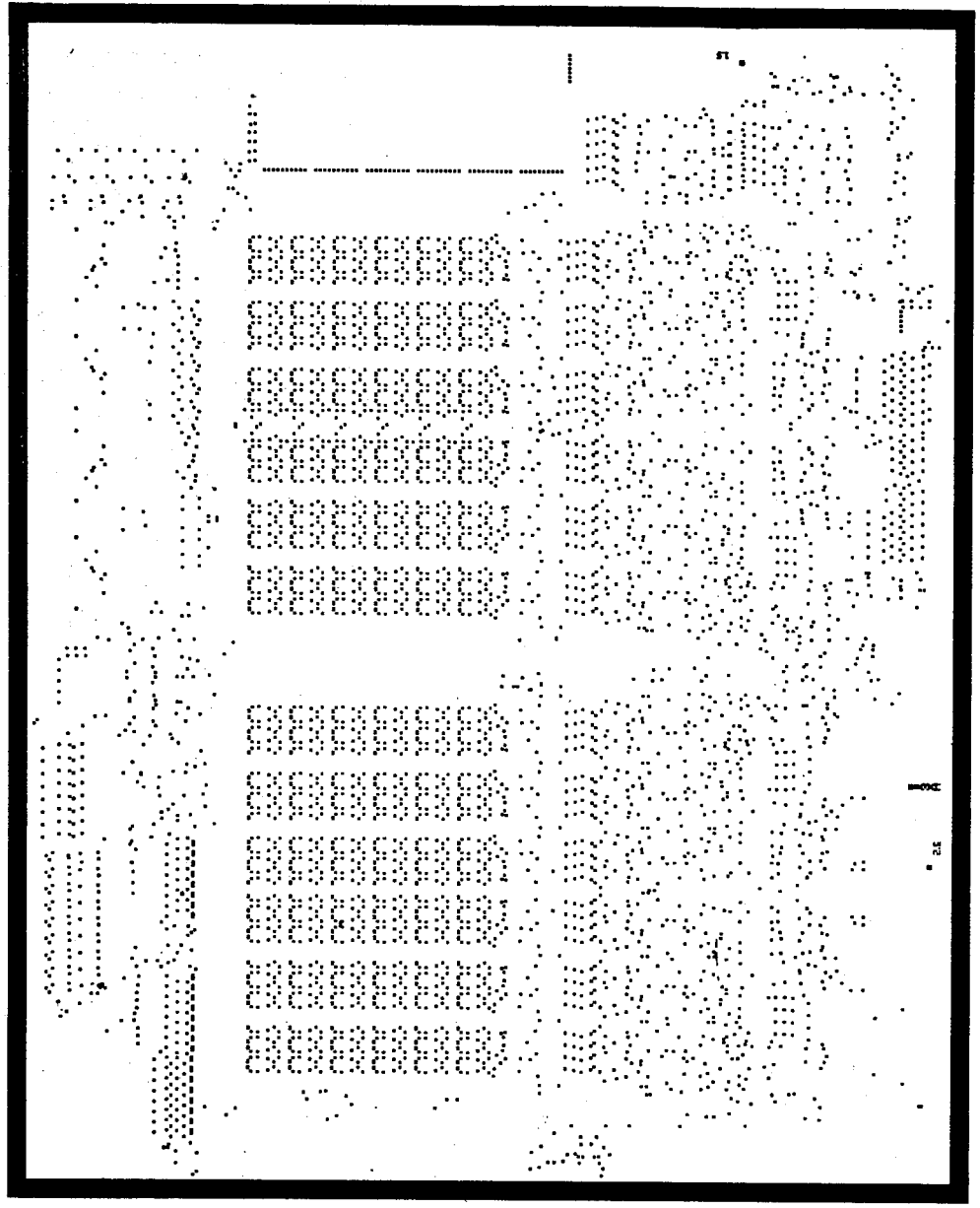
FIG. 6 is a scale reproduction of a photomask utilized to define the contacts made between the polycrystalline silicon conductors and the diffused regions of the integrated circuit of the present invention.

Referring now to FIGS. 2A and 2B, there is shown a block diagram of the character recognition system in which the present embodiment is utilized including a slot scanner 20 which causes a laser beam to be reflected to produce a scanned pattern above and in front of a slot or opening adjacent the laser. If a UPC tag is placed such that the laser beam crosses the tag, thereby reflecting the light from the bars and spaces which compose the UPC tag, a photodetector receiving the reflected light will transform the reflected light into an electrical signal. A video amplifier (not shown) located in the scanning unit generates, in response to the generated electrical signals, digital pulses $\overline{STV}$ (Set Video) indicating a space-to-bar transition and $\overline{RTV}$ (Reset Video) indicating a bar-to-space transition. The time interval between these pulses is a function of the width of the bar or space. The pulse width of the signals $\overline{STV}$ and $\overline{RTV}$ can be from 25 nanoseconds to 2 microseconds. Alternate valid signals are never closer together than 350 ns. This means that following a valid STV or RTV, multiple pulses may occur during this 350 ms. time period.

Figure 1:
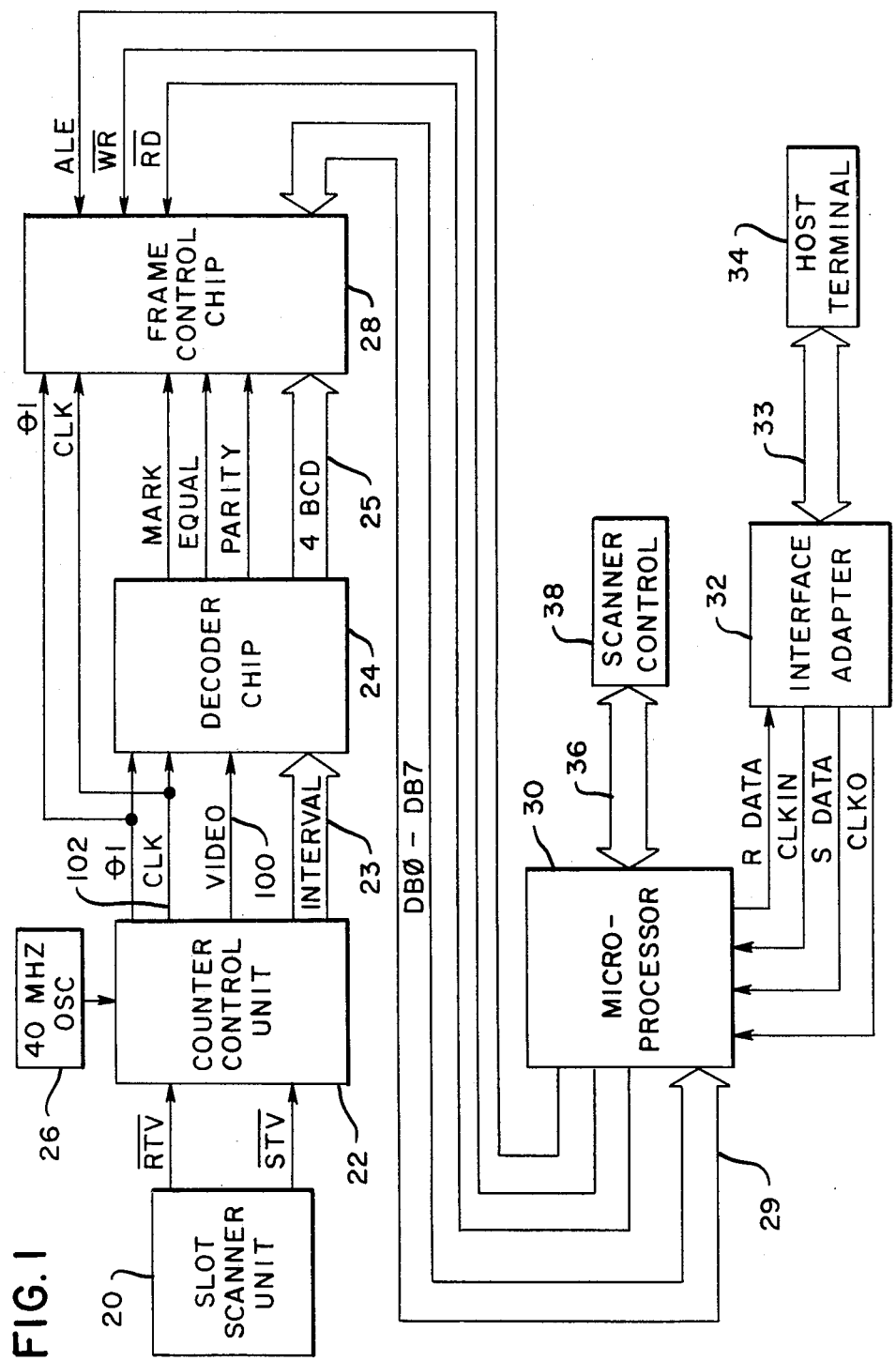
FIG. 1 is a block diagram illustrating a pattern recognition and scanning system in which the integrated circuit of the present invention is included.

These time intervals are transmitted to a counter control 22 (FIG. 1) in which the intervals are converted to a binary number by an interval counter which is part of a FIFO (First-In, First-Out) IC array. The FIFO time averages the time between intervals to an acceptable period. Either of the signals $\overline{STV}$ and $\overline{RTV}$ will stop the interval counter and cause that interval count along with the state of a VIDEO flip-flop (not shown) to be stored in a FIFO shift register (not shown). The VIDEO flip-flop will be true for a bar. The interval counter at this point is reset and the next interval count is started. If the output of the interval counter is greater than 1280 counts (32 us.), a overflow condition is created. In the overflow state, every 800 ns. of the count of 1280 and the last state of the VIDEO flip-flop will be loaded into the FIFO shift register. The occurrence of the next $\overline{STV}$ or $\overline{RTV}$ signal will result in the loading of an additional 1280 count into the FIFO shift register. This condition will cause an error signal to be generated which, as will be described more fully hereinafter, will be sensed by the system at this time. Using this error signal, the system will disregard the data that is being generated by the slot scanner unit 20 and the counter control unit 22. The data contained in the FIFO shift registers located in the counter control 22 will be outputted to a decoder chip 24 which is the subject of the present application under the control of clock pulses generated by a 40 Mhz. oscillator 26. The FIFO shift registers will output 11 bits of binary data representing the width of the interval being scanned over bus 23 (FIG. 1) together with a VIDEO signal indicating whether the interval is a bar or a space. Also outputted from the counter control unit 22 to the decoder chip 24 are clock pulses CLK.

The decoder chip 24 (FIG. 1) contains a number of binary adders, comparators, shift registers and discrete logic elements which are used to decode the data being scanned by the slot scanner unit 20. The decoder chip 24 will output a hexadecimal number which includes four BCD bits representing a decimal character in addition to indicating margins, center bands and error. Three additional binary bits are outputted by the decoder chip 24 which represent the signal MARK to indicate the interval is a bar or a space, the signal EQUAL indicating that the current interval taken together with the three previous intervals are either equal or not equal in width to the previous four intervals, and the signal PARITY indicating that the interval is either odd or even parity, thereby locating the interval on the left or right side of the center band.

The output signals from the decoder chip 24 are transmitted to a frame control chip 28 (FIG. 1) which separates the valid data from the invalid data being outputted by the decoder chip 24. The frame control chip 28 filters out this valid data by checking for framing characters, that is, in and out margins, in and out center bands, and character equality to identify the valid characters being decoded by the decoder chip 24. A good segment of valid data is then transmitted over bus 29 to a microprocessor 30 for further processing. The frame control chip 28 functions also as a communication adapter for transmitting data to be sent from the microprocessor through an interface adapter 32 to a host terminal 34 over bus 33. The microprocessor 30 monitors photodetectors in the slot scanner unit 20 to determine when an item is in position to be read by the slot scanner. This data is transmitted to the microprocessor 30 over a bus 36 coupled to a scanner control unit 38. Upon receiving the required control signals, the microprocessor will then start monitoring the frame control chip 28 for information. The microprocessor does correlation analysis and modulo ten check to determine if it has a valid tag. Once a valid tag is assembled, the data is transmitted to the host terminal through the interface adapter 32. Reference should be made to the co-pending application Amacher et al Ser. No. 043,933 and Naseem et al. Ser. No. 043,928 filed on the same date as the present application for a full disclosure of the details of the operation of the frame, that is the control chip 28 and the microprocessor 30, respectively, each assigned to the present assignee of the application.

The basic circuit configuration of the present invention is illustrated in FIGS. 2A and 2B. The input logic interface 80 receives data from the pattern recognition array. The input interface logic 80 includes an input latch, a BCD function decoder, a frame decoder, and a shift register data latch.

Four binary coded hexadecimal data bits plus a parity bit are outputted from the input logic 80 to each of a group of twelve shift registers 82, which are used to "capture" valid data. The capture of the data by the shift registers 82 is controlled by four frame state counters 85. These four counters use the decoded binary coded hexadecimal functions and frames from the input interface logic 80 to detect which segments of data are valid and should be captured. Circuitry associated with the one of shift registers 82 in which the valid data is contained notifies the microprocessor 86 when a valid segment is captured.

The valid data is transmitted over the SR data bus 88 to the command decode logic 90, which also contains bus drivers. Command decode logic 90 sends the valid data to the microprocessor 86 over the microprocessor data bus 92 in response to an appropriate command received by microprocessor 86 (which is not included in the frame control chip 28).

The SR data bus 88 also connects the command decode logic 90 with a host communication interface 94. This interface is necessary to couple the microprocessor with a peripheral device, such as a terminal 96. The terminal is linked to the communication interface 94 via an optically coupled interface adapter (OCIA) 98. When the microprocessor 86 wishes to send data to the terminal 96, the data travels over the DB bus 92 to the host communication interface 94, which signals the terminal 96.

The terminal 96 sends data to the microprocessor in a similar manner. The terminal 96 clocks the data via the OCIA 98 to the host communication interface 94, which notifies the microprocessor 86 that there is data waiting. The microprocessor 86 then transmits a signal which loads the data onto the SR data bus 88. The interface 90 transfers the data from the SR bus 88 to the processor DB bus 92 and sends the data to the microprocessor 86.

The parity of the valid data segment is detected by the parity decode ROM 99. The ROM 99 receives the parity data from the SR bus 88 and sends the decoded information to the command decode logic 90, which sends the information to the processor 86 via the DB bus 92.

It should be noted that microprocessor 86, OCIA 98 and terminal 96 are not included in frame control integrated circuit 28, and are included only to facilitate the foregoing discussion of the operation of frame control chip 28.

Referring now to FIG. 3, frame control chip 28 includes consecutively located edges 111, 112, 113, and 114, which form a rectangle. Input buffer circuitry contained in block 80 of FIG. 2A is contained in section 40, which is positioned along edges 111 and 114. Section 41 includes the registers F3A, F3B, and F3C of FIG. 2A. Section 42 includes shift registers F1A, F1B and F1C of FIG. 2A. Section 43 includes shift registers F2A, F2B and F2C of FIG. 2A. Section 44 contains shift registers F0A, F0B and F0C of FIG. 2A.

Figure 7:
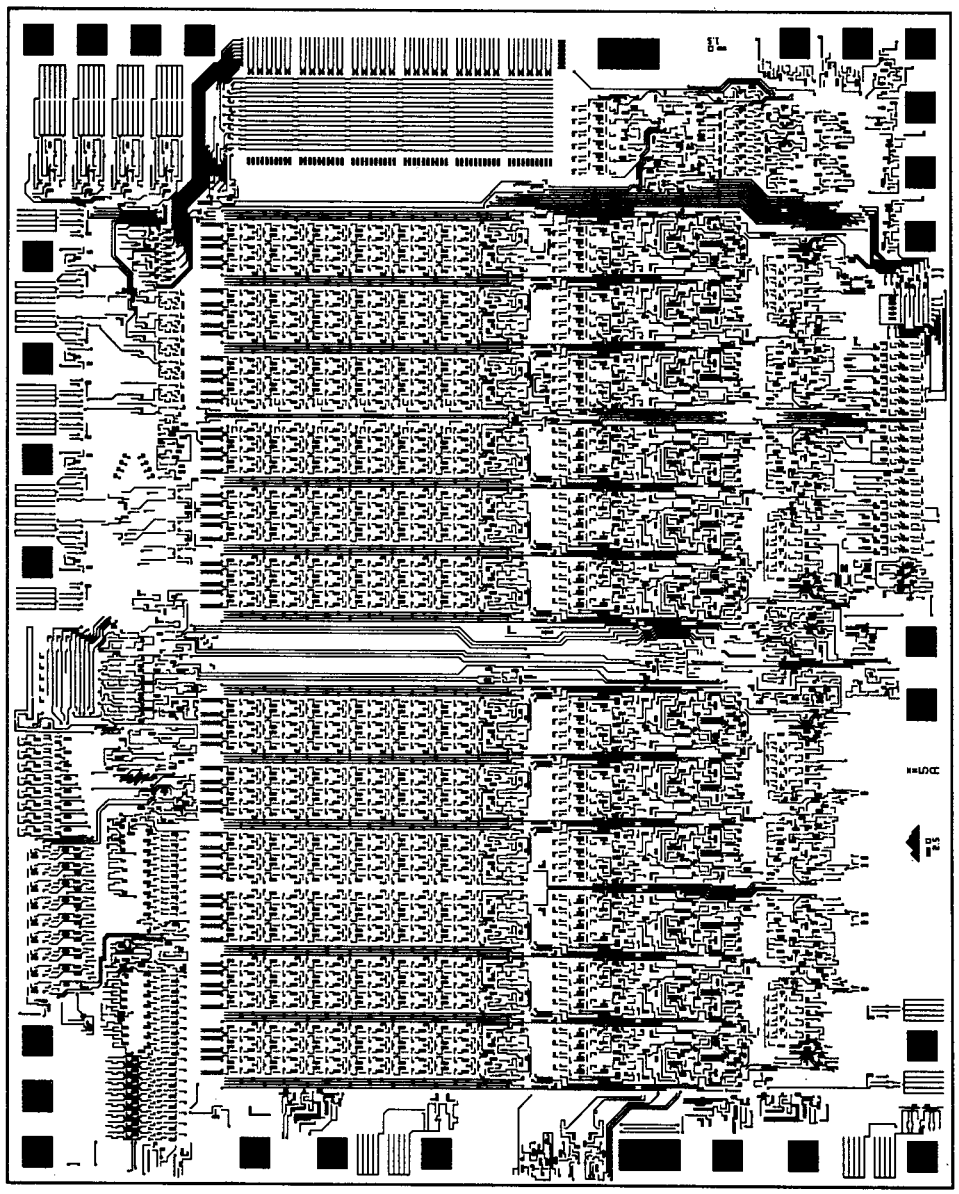
FIG. 7 is a scale reproduction of a photomask utilized to define the pattern of the polycrystalline silicon layer of the integrated circuit of the present invention.
Figure 8:
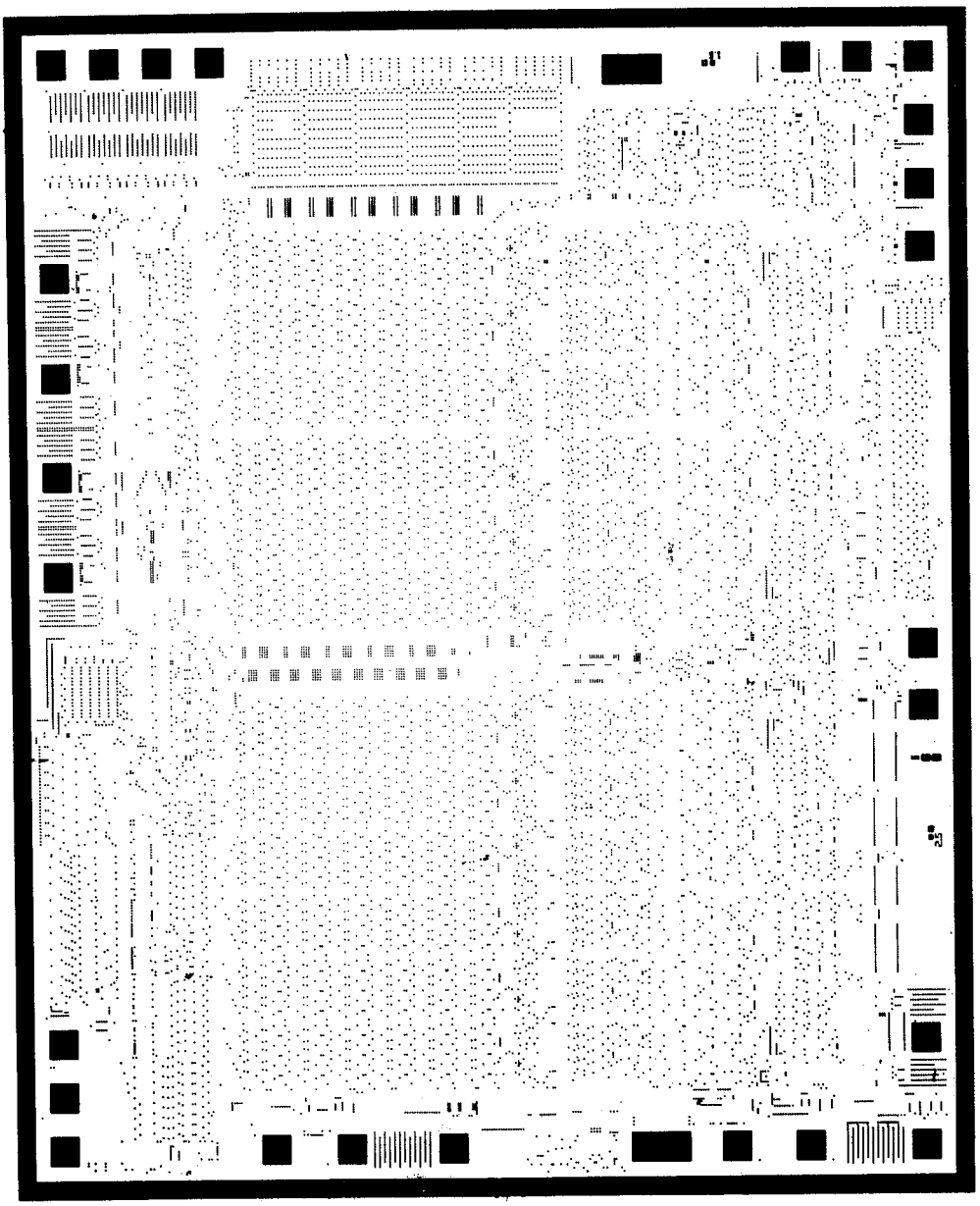
FIG. 8 is a scale reproduction of a photomask utilized to define the patterns of all conductor interconnection contacts in the integrated circuit of the present invention.

The placement of shift registers F0A, F0B, and F0C are indicated by blocks 44C, 44B and 44A, respectively, in FIG. 7A. The placement of shift registers F3C, F3B, and F3A is indicated by reference numerals 41A, 41B, and 41C, respectively, in FIG. 7A. The placement of shift registers in section 42, from left to right, is F1A, F1B, F1C. The position of shift registers in section 43 from left to right is F2C, F2B, and F2A. It was necessary to have parallel outputs from shift registers F0A and F2A. This made it desirable to place shift registers F0A and F2A adjacent to each other, as shown in FIG. 7A. It was also necessary to provide more connections between shift register F0C and circuitry in periodic clock control section 50 than for others in the shift registers. This led to positioning shift register F0C as close as possible to section 50, as subsequently explained. Periodic clock control section 50 was placed near edge 113 partly because this chip area was made available by placement of read only memory 45 along edge 113.

Read only memory 45 was placed along edge 113 to minimize lengths of connections between read only memory 45 and the input/output buffers in section 55, which is located along edge 112 in the upper right hand corner of chip 28.

The foregoing considerations led to arranging of the shift registers in section 43 in a pattern which is the mirror image of the arrangement in section 44. Thus, shift registers F0A and F2A are adjacent. A special shift register cell which allowed providing parallel outputs to the control logic was provided. It should be noted that the original layout plan called for arrangement of the shift registers in the order F0A, F0B, F0C, F1A, F1B, F1C, F2A, F2B, F2C, F3A, F3B, and F3C. It was discovered that this approach would have required a substantially larger chip size.

A read only memory (ROM) (which decodes the order of the character word data received from one of the shift registers before outputting that data to microprocessor 86 of FIG. 2B to produce the PARITY bit which indicates that the bar coded label has been scanned from right to left, rather than from left to right) is located in section 45, adjacent to edge 113.

The above mentioned sections 41, 42, 43, 44 and 45 are located generally closer to edge 112 than to edge 114, but are separated from edge 112 by parallel-to-serial, serial-to-parallel conversion circuitry contained in section 53. The circuitry in section 53 operates to effect communication with host terminal 96 in FIG. 2B and contains circuitry in block 94 of FIG. 2B.

Microprocessor command decode circuitry is located in section 54, which includes the circuitry of block 90 of FIG. 2B, and is located in section 54 adjacent to edge 112. By placing section 54 so that the outputs of the microprocessor command decode logic could be routed through section 17' to the respective shift register contol logic sections 46–49, a minimum capacitance is obtained for the longest output line. The signals on microprocessor bus 92 (FIG. 2B) are received by bonding pads and input buffers in section 55, which is located adjacent the microprocessor command decode section 54 in order to minimize chip area consumed by routing the outputs of the I/O buffers in section 55 to microprocessor command decode section 54. The placement of parallel-to-serial, serial-to-parallel conversion circuitry in section 55 adjacent to microprocessor command decode section 54 resulted in making efficient use of chip area made available by the above mentioned placement of sections 54 and 55 and effected convenient routing of signals on bus 88 (FIG. 2B) from the various shift registers to the circuitry in section 53 (which corresponds to circuitry in block 94 of FIG. 2B). The original layout plan was to distribute the circuitry in section 53 uniformly across the top of chip 28 as shown in FIG. 3, but for the foregoing reasons involving placement of sections 54 and 55, it became necessary to place section 55 as shown.

A plurality of shift register bits are contained in section 52, which is located along edge 114. A number of shift register buffers located in section 52 provide signals which are utilized in various locations in chip 28, especially in the lower left portion of the chip as shown in FIG. 3. The original layout plan called for placement of the various shift register buffers close to the various circuitry which received signals produced at the outputs of these shift register buffers. Due to the fact that the shift register buffers all receive a common clock signal, it was found that less chip area was required to group all of the shift register buffers in section 52 and route the outputs to the necessary locations than to utilize the initial layout plan for these shift register buffers. The amount of capacitance for the clock line, and consequently the amount of chip area required for the clock generator required to generate the common clock signal, was substantially reduced by grouping all of the subject shift register buffers in section 52.

Buffers for the PARITY, and EQUAL bits and BCD0-BCD3 are contained in section 52, which is located adjacent the lower right hand corner of frame control chip 28 along edges 113 and 114 thereof. The bonding pads and input buffers for the PARITY, EQUAL, BCD0, BCD1, BCD2, and BCD3 inputs are located in section 51 in the lower right hand corner of chip 28 in order to enable the respective bonding pads to be wire bonded to predetermined leads of the package in which chip 28 is housed and to enable the outputs of the corresponding input buffers to be routed to the state counters in sections 56, 57, 58, and 59.

FIG. 7A shows the circuit sections in FIG. 3 superimposed accurately upon the reduced scale reproduction of the photomask used to define the pattern of the polycrystalline silicon layer of frame control chip 28.

Numerous design trade-offs and trial layouts were required to determine the illustrated relative locations of the frame state counters and the associated shift register frame control logic circuitry. The frame control logic circuitry (such as that contained in section 46), includes, for each of the shree shift registers included in each group, priority logic, a frame latch which inhibits clocking of BCD characters into that shift register when a properly formatted BCD character has been loaded therein, a load latch which enables data to be clocked out of the shift register onto the microprocessor data bus, reset logic circuitry which enables the power on reset circuitry or a microprocessor command to reset that register, an enable counter to control enabling shifting of a character into the next shift register of the group, and a shift register clock circuit.

Figure 9:
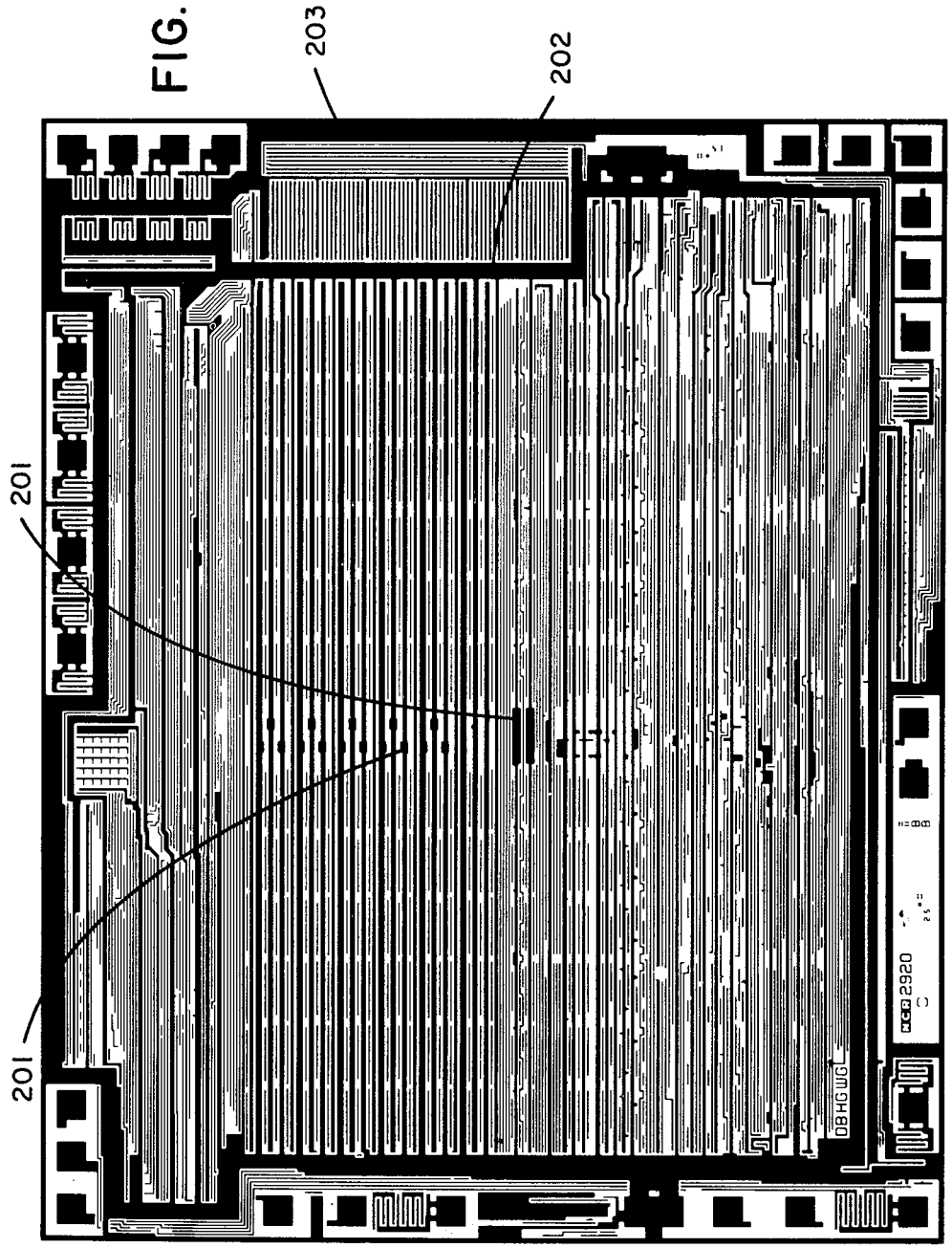
FIG. 9 is a scale reproduction of a photomask utilized to define the pattern of the metal interconnection layer of the integrated circuit of the present invention.
Figure 10:
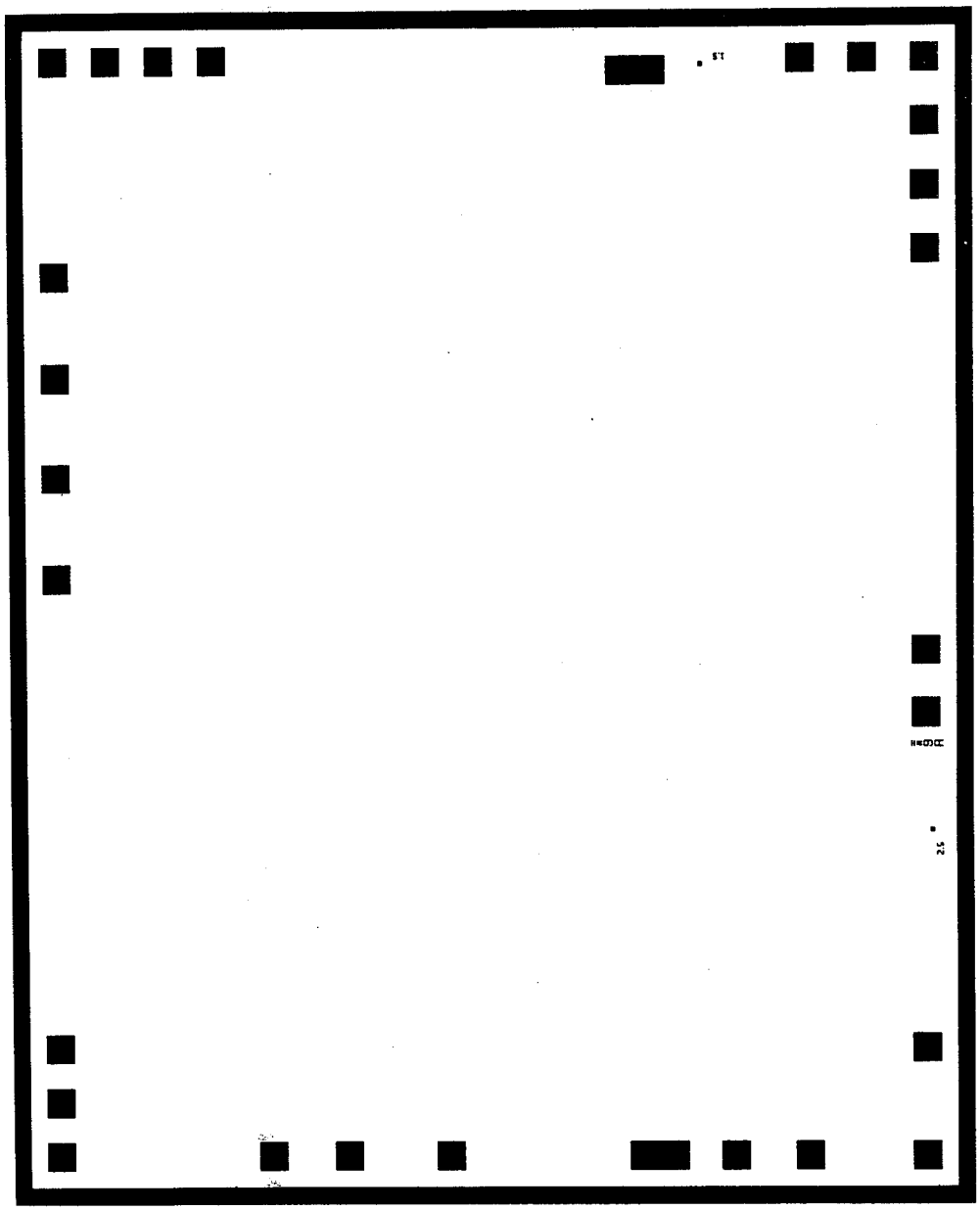
FIG. 10 is a scale reproduction of a photomask utilized to define the pattern for the passivation layer of the integrated circuit of the present invention.

The read only memory in section 45 was placed along the right hand edge 113 of frame control chip 28 rather than in the section 17' between sections 42 and 43. Section 17' contains some vertical polycrystalline silicon conductors and does not utilize the chip area in section 17' for placement of logic circuitry because additional area required for conducting operating power to the read only memory in section 45 and the periodic clock control circuitry in section 50 would result in a larger chip size if these sections were placed between sections 42 and 43. A plurality of metal shorting bars, such as 201, are provided on the metal layer shown in FIG. 9 to reduce voltage drops in the $V_{SS}$ conductors and the $V_{CC}$ conductors. The $V_{SS}$ shorting strip 203 and a $V_{CC}$ shorting strip 202 were provided around read only memory 45 to reduce voltage drops along the respective power supply voltage conductors.

Placement of the clock generator and toggle control circuitry in section 60 between the adjacent frame control circuitry sections permits use of balanced lengths of output lines driving the state counters and shift register control logic. This minimizes RC time delays which would result if particular output lines from the clock generator and toggle circuitry in section 47 were each required to extend across all of sections 46, 47, 48 and 49, rather than only two of of these sections.

A reset driver circuit was included in section 60 for providing reset signals to the respective frame shift register control logic sections 46, 47, 48, and 49 at the appropriate times. The circuitry in section 60 includes circuitry which receives information indicating when a valid character has been clocked into a particular one of the twelve shift registers. As mentioned above, associated with each of the twelve shift registers, respectively is a frame latch and a load latch (not shown in FIG. 2). The respective frame latches and load latches are controlled by adjacent frame shift register control logic. When a particular shift register has received a valid character, its frame latch is set, preventing any further information from being clocked into that shift register. After a valid character has been "captured" by setting of the frame latch for the capturing shift register, the load latch for that shift register is set. The load latch enables the captured character to be transmitted onto bus 88 in FIG. 2. The circuitry in section 60 includes a twelve input NOR gate which receives the outputs from the twelve load latches referred to above. The twelve frame latches and load latches are contained in their respective frame shift register control logic sections 46, 47, 48 and 49. The initial plan for the layout for this section was to provide a distributed NOR gate which included a plurality of input MOSFETS located close to the outputs of the respective load latches. In order to reduce the capacitance of the output of the twelve input NOR gate, it was found to be desirable to instead locate the entire twelve input NOR gate in section 60 and conduct the load latch outputs to the inputs of the twelve input NOR gate. These load signals then are decoded in section 60 to determine whether the present frame count is an even frame count (causing the F0 register group or the F2 register group to be clocked by its corresponding shift register control logic) or an odd frame (causing the F1 or F3 shift register group to be clocked by its corresponding shift register control logic). Location of section 60 midway across the chip, as shown in FIGS. 3 and 7A, facilitated the above described approach to decoding the load latch outputs and enabled convenient routing of signals between microprocessor command decode logic 54 and the respective frame shift register control logic sections. The outputs of circuitry in section 60 are utilized to control the four state counters. Acceptably low output capacitances are achieved by virtue of the central location of section 60.

Numerous trial layouts and much consultation between the chip designer and the circuit designer were required to arrive at a topography which effectively balances the previously mentioned trade-offs to obtain the high performance and minimum area configuration for frame control chip 28 shown in the drawings.

It should be noted that the scale reproductions of the photomask shown in FIGS. 4–10 can be used by one skilled in the art to produce a mask set which can be used to manufacture chip 28 in accordance with well known N-channel MOS manufacturing processes.

While the invention has been described with respect to a particular embodiment thereof, variations in the illustrated topography can be made by those skilled in the art without departing from the true spirit and scope of the invention.

We claim:

1. An integrated circuit for sequentially receiving a plurality of digital character words produced in response to optical scanning of a bar coded label and also receiving a plurality of corresponding binary signals representing, respectively, validity, scanning direction, and timing of the digital character words and outputting formatted character words to a digital processor system coupled to said integrated circuit, said integrated circuit comprising in combination:
   a. first means for receiving said digital character words and said binary signals;
   b. a plurality of storage means coupled to said first means for storing predetermined ones of said digital character words, wherein said plurality of storage means includes a plurality of groups of shift registers, each of which shift registers is capable of storing one of said digital character words;
   c. second means responsive to said first means for routing predetermined ones of said digital character words into predetermined ones of said plurality of storage means, wherein said second means includes a plurality of counter circuits for controlling said routing of said digital character words to predetermined ones of said plurality of groups of shift registers; and
   d. third means responsive to said digital processor system for receiving commands from said digital processor system and also effecting outputting of digital character words from said predetermined ones of said storage means to said digital processor system, said integrated circuit having first, second, third, and fourth sequentially located edges, the portion of said first means receiving said digital character words generally being located substantially closer to said first and fourth edges than to said second and third edges to effect conducting said digital character words from bonding pads adjacent to said first and fourth edges, said plurality of groups of shift registers generally being located between said second means and said second edge, said third means being located substantially closer to said second edge than to said fourth edge.

2. The integrated circuit of claim 1 wherein said plurality of groups of storage means includes first, second, third, and fourth groups, each containing three of said shift registers, said second means including first, second, third, and fourth ones of said counter circuits coupled, respectively, to said first, second, third and fourth groups of shift registers.

3. The integrated circuit of claim 2 wherein said second means further includes first, second, third, and fourth shift register control circuit means responsive to said first, second, third and fourth counter circuits, respectively, for controlling said routing of said digital character words to said shift registers contained in said first, second, third, and fourth groups, respectively.

4. The integrated circuit of claim 3 wherein said first, second, third, and fourth shift register control circuit means are located between said first, second, third, and fourth counter circuits and said first, second, third, and fourth group of shift registers, respectively.

5. The integrated circuit of claim 4 wherein said first, second, third, and fourth counter circuits are sequentially actuated to sequentially route digital character words from said first means into said first, second, third, and fourth groups of shift registers, said first and third counter circuits being located substantially closer to said first edge than said third edge, said second and fourth counter circuits being located closer to said third edge than said second edge.

6. An integrated circuit for sequentially receiving a plurality of digital character words produced in response to optical scanning of a bar coded label and also receiving a plurality of corresponding binary signals representing, respectively, validity, scanning direction, and timing of the digital character words and outputting formatted character words to a digital processor system coupled to said integrated circuit, said integrated circuit comprising in combination:
   a. first means for receiving said digital character words and said binary signals;

b. a plurality of storage means coupled to said first means for storing predetermined ones of said digital character words, wherein said plurality of storage means includes a plurality of groups of shift registers, each of which shift registers is capable of storing one of said digital character words;

c. second means responsive to said first means for routing predetermined ones of said digital character words into predetermined ones of said plurality of storage means, wherein said second means includes a plurality of counter circuits for controlling said routing of said digital character words to predetermined ones of said plurality of groups of shift registers; and d. third means responsive to said digital processor system for receiving commands from said digital processor system and also effecting outputting of digital character words from said predetermined ones of said storage means to said digital processor system, said integrated circuit having first, second, third, and fourth sequentially located edges, the portion of said first means receiving said digital character words generally being located substantially closer to said first and fourth edges than to said second and third edges to effect conducting said digital character words from bonding pads adjacent to said first and fourth edges, said plurality of groups of shift registers generally being located between said second means and said second edge, said third means being located substantially closer to said second edge than to said fourth edge, said plurality of groups of shift registers including first and second subgroups of said shift registers separated by a portion of said integrated circuit through which conductors for effecting outputting of said digital characters from predetermined ones of said shift registers are routed from respective ones of said shift registers to said third means to reduce lengths and capacitances of said conductors, said integrated circuit including input/output means for effecting receiving of said commands and outputting of digital character words by said third means, said input/output means being located adjacent to said third means and adjacent to said second edge to minimize the amount of area of said integrated circuit utilized for routing of conductors for conducting the received commands and the outputted digital character words, said integrated circuit including a plurality of shift register buffer circuits which are grouped together adjacent to said fourth edge to reduce the capacitance of a conductor for conducting a clock signal to said shift register buffer circuits and thereby reduce the amount of area of said integrated circuit required for a clock driver circuit for driving said clock conductor.

* * * * *